United States Patent
McEwan

(10) Patent No.: US 7,551,703 B2
(45) Date of Patent: Jun. 23, 2009

(54) RATE LOCKED LOOP RADAR TIMING SYSTEM

(75) Inventor: Thomas Edward McEwan, Las Vegas, NV (US)

(73) Assignee: McEwan Technologies, LLC, Las Vegas, NV (US)

(*) Notice: Subject to any disclaimer, the term of this patent is extended or adjusted under 35 U.S.C. 154(b) by 616 days.

(21) Appl. No.: 11/343,049

(22) Filed: Jan. 30, 2006

(65) Prior Publication Data

US 2007/0177704 A1    Aug. 2, 2007

(51) Int. Cl.
*H03D 3/24* (2006.01)
(52) U.S. Cl. .................................... 375/376
(58) Field of Classification Search ............... 375/376
See application file for complete search history.

(56) References Cited

U.S. PATENT DOCUMENTS

| | | | |
|---|---|---|---|
| 3,944,925 A | 3/1976 | De Laune | |
| 4,118,673 A | 10/1978 | Hafner | |
| 4,132,991 A | 1/1979 | Wocher et al. | |
| 4,297,701 A | 10/1981 | Henriques | |
| 4,446,425 A | 5/1984 | Valdmanis et al. | |
| 5,001,683 A | 3/1991 | Fukumoto et al. | |
| 5,563,605 A | 10/1996 | McEwan | |
| 6,055,287 A * | 4/2000 | McEwan | 375/376 |
| 6,072,427 A | 6/2000 | McEwan | |
| 6,300,838 B1 * | 10/2001 | Kelkar | 331/17 |
| 6,373,428 B1 | 4/2002 | McEwan | |
| 6,404,288 B1 | 6/2002 | Bletz et al. | |
| 2004/0119548 A1 * | 6/2004 | Karlquist | 332/112 |

OTHER PUBLICATIONS

Sen, "Stability Analysis of Induction Motor Drives Using Phase-Locked Loop Control System", IEEE Transactions on Industrial Electronics and Control Instrumentation, vol. IECI-27, Issue 3, Aug. 1980 pp. 147-155.*
Touzni, "Differential carrier loop estimation for digital vestigial side band modulation", IEEE International Conference on Acoustics, Speech, and Signal Processing, 2002, Proceedings. (ICASSP '02). International Conference on vol. 3, May 13-17, 2002 pp. III-2449-III-2452 vol. 3.*
Stepp, "Frequency-feedback tuning for single-cell cavity under RF heating", Particle Accelerator Conference, 1993, Proceedings of the 1993, May 17-20, 1993 pp. 1408-1410 vol. 2.*

* cited by examiner

*Primary Examiner*—Juan A Torres

(57) ABSTRACT

A rate locked loop (RLL) regulates phase slip between two clock signals to provide precision timing for radar, TDR and laser ranging systems. Two clocks having a small mutual frequency offset exhibit a slowing changing relative phase, or phase slip, that produces a stroboscopic time expansion effect in a ranging system. A phase detector converts clock phase to voltage and the voltage is differentiated to provide a rate-of-change signal to a loop controller that precisely regulates the rate-of-phase change. The RLL controls a VCO to produce a constant, linear phase slip having phase errors below the time equivalent of 1-picosecond.

13 Claims, 5 Drawing Sheets

FIG. 2a     FIG. 2b

RATE LOCKED LOOP RADAR TIMING SYSTEM

BACKGROUND OF THE INVENTION

1. Field of the Invention

The present invention relates to radar timing circuits, and more particularly to precision swept delay circuits for expanded time ranging systems. It can be used to generate a swept-delay dock for sampling radar, time domain reflectometry (TDR) and laser systems.

2. Description of Related Art

High accuracy pulse-echo ranging systems, such as wideband and ultra-wideband pulsed radar, pulsed laser rangefinders, and time domain reflectometers, sweep a timing circuit across a range of delays. The timing circuit controls a receiver sampling gate such that when an echo signal coincides with the temporal location of the sampling gate, a sampled echo signal is obtained. The echo range is then determined from the timing circuit, so high timing accuracy is essential. A beneficial feature for high accuracy is time expansion, whereby the receiver sampling rate is set to a slightly lower rate than the transmit pulse rate to create a stroboscopic time expansion effect that expands the apparent output time by a large factor, such as 100,000. Expanded time allows vastly more accurate signal processing than possible with realtime systems.

A common approach to generate accurate swept timing employs two oscillators with frequencies $F_T$ (e.g., a transmit clock frequency) and $F_R$ (e.g., a receive clock frequency) that are offset by a small amount $F_T - F_R = \Delta$. In a ranging application, a transmit dock at frequency $F_T$ triggers transmit pulses, and a receive dock at frequency $F_R$ gates the echo pulses. If the receive dock is lower in frequency than the transmit clock by a small amount $\Delta$, the phase of the receive clock can smoothly and linearly slip relative to the transmit clock such that one full cycle is slipped every $1/\Delta$ seconds. Typical parameters are: transmit clock $F_T=2$ MHz, receive dock $F_R=1.99999$ MHz, offset frequency $\Delta=10$ Hz, phase slip period=$1/\Delta=100$ milliseconds, and a time expansion factor of $F_T/\Delta=200,000$. This two-oscillator technique was used in the 1960's in precision time-interval counters with sub-nanosecond resolution, and appeared in a short-range radar in U.S. Pat. No. 4,132,991, "Method and Apparatus Utilizing Time-Expanded Pulse Sequences for Distance Measurement in a Radar," by Wocher et al.

The accuracy of the two-oscillator technique is limited by the differential and integral linearity of the phase slip between the two oscillators. The accuracy of the phase slip is not easy to measure accurately and it is also easy to assume it is somehow perfect. Commercial pulse echo radar rangefinders having a claimed accuracy in the millimeter range require error correction look-up tables, which indicates that high accuracy timing systems do not presently exist.

There are many influences that can affect the smoothness of the phase slip, including: (1) oscillator noise due to thermal and flicker effects, (2) transmit-to-receive clock cross-talk, and (3) thermal transients that typically do not track out between the two oscillators. The receive oscillator is typically locked to the offset frequency by a phase locked loop (PLL) circuit, which does a reasonable job when the offset frequency is above several hundred Hertz. Unfortunately, precision long range systems require extremely high accuracy, on the order of picoseconds, at offset frequencies on the order of 10 Hz. A PLL system cannot meet this requirement for the simple reason that the PLL loop response must be slower than $1/\Delta$, or typically slower than 100 ms, which is far too slow to control short term phase errors between the two clocks.

U.S. Pat. No. 6,404,288 to Bletz et al addresses the problems associated with controlling low offset frequencies by introducing three additional oscillators into a system that can include, for example, seven counters and two phase comparators, all to permit PLL control at higher offset frequencies than the final output offset frequency, which is obtained by frequency down-mixing. This system is too complex for many commercial applications and it does not control instantaneous voltage controlled oscillator (VCO) phase errors and crosstalk.

A need exists for a compact low cost method and precision timing system that instantaneously controls phase slip errors to produce extremely smooth and accurate phase slip rates. The present invention is directed to such a need.

SUMMARY OF THE INVENTION

The present invention provides a rate locked loop (RLL) arrangement to provide timing for a pulse-echo rangefinder that can include, but is not necessarily limited to, a phase detector responsive to phase between first and second clock signals for producing an output proportional to phase, a differentiator to produce a derivative signal and a controller responsive to the derivative signal for producing a feedback signal to the phase control.

Another aspect of the present invention provides a method for generating clock signals having a relative phase slip that includes: generating a first clock frequency, generating a second clock frequency, detecting the phase between the first and second clock frequencies to produce a phase signal, differentiating the phase signal to produce a derivative signal; and controlling the second clock phase using the derivative signal to produce a controlled phase slip.

A final aspect of the present invention provides for a radar, laser or time domain reflectometry (TDR) system that can include, but is not limited to: a transmitter triggered by a first clock signal, a receiver gated by a second clock signal, a phase detector responsive to phase between the first and second clock signals for producing a phase signal, a differentiator for producing a derivative signal from the phase signal, a phase control for adjusting the phase of the second clock signal; and a controller responsive to the derivative signal for producing a feedback control signal to the phase control.

The present invention can be used in expanded time radar, laser, and TDR ranging systems having picosecond accuracy. Applications include pulse echo rangefinders for tank level measurement, environmental monitoring, industrial and robotic controls, digital handwriting capture, imaging radars, vehicle backup and collision warning radars, and universal object/obstacle detection and ranging.

BRIEF DESCRIPTION OF THE DRAWINGS

FIG. 2a depicts a two oscillator frequency source.

FIG. 2b depicts a single oscillator frequency source including a phase adjuster.

DETAILED DESCRIPTION OF THE INVENTION

A detailed description of the present invention is provided below with reference to the figures. While illustrative component values and circuit parameters are given, other embodiments can be constructed with other component values and circuit parameters. All U.S. patents and copending U.S. applications cited herein are herein incorporated by reference in their entirety.

General Description

The present invention overcomes the bandwidth limitations of a PLL controller by directly controlling the phase slip rate on a continuous and instantaneous basis. A beneficial example embodiment, as disclosed herein, employs a phase detector coupled directly between two oscillators, rather than through counter chains that are customary in PLL circuits, to produce a voltage proportional to instantaneous phase. When the phase between the oscillators slips at a constant rate, because of the offset frequency, the phase detector output is a linear voltage ramp that increases for increasing phase values between 0 and $2\pi$ and then it resets to 0 at $2\pi$, i.e., at the phase wrap point. The voltage ramp repeats at the offset frequency $\Delta$. The voltage ramp is differentiated by a derivative circuit to produce a constant voltage proportional to the slope of the ramp, which can be termed the derivative voltage. The derivative voltage is applied to a feedback controller that controls the phase and frequency of one of the oscillators to maintain a constant phase slip rate. If the phase slip rate or smoothness varies, the gain of the feedback controller, often a high gain feedback controller, instantaneously corrects any deviations from a perfectly linear phase slip.

The derivative circuit in the feedback loop controls the rate of phase change rather than the phase itself. Consequently, such a loop can be termed a rate locked loop, or RLL. Compared to a PLL system, the loop bandwidth of an RLL can be orders of magnitude higher. Therefore, high accuracy swept timing can be realized at very low offset frequencies. For example, offset frequencies as low as about 1/100 Hz have been realized with, for example, 10 MHz oscillators using the present invention, with an associated time expansion factor of 1-billion.

A single oscillator implementation of the RLL can also be realized by substituting a phase adjuster circuit for the second oscillator. The loop controller sweeps the phase produced by the phase adjuster to produce a swept-phase receive clock. Ranging systems generally require swept phase over $\frac{1}{4} \pi$ or less since the remaining $\frac{3}{4} \pi$ is needed for echoes to settle before the next transmit pulse. Consequently, the phase adjuster of the present invention is often designed to, but not limited to, slip phase over a limited range before being reset from a selected maximum phase to zero.

Specific Description

Figure 1:
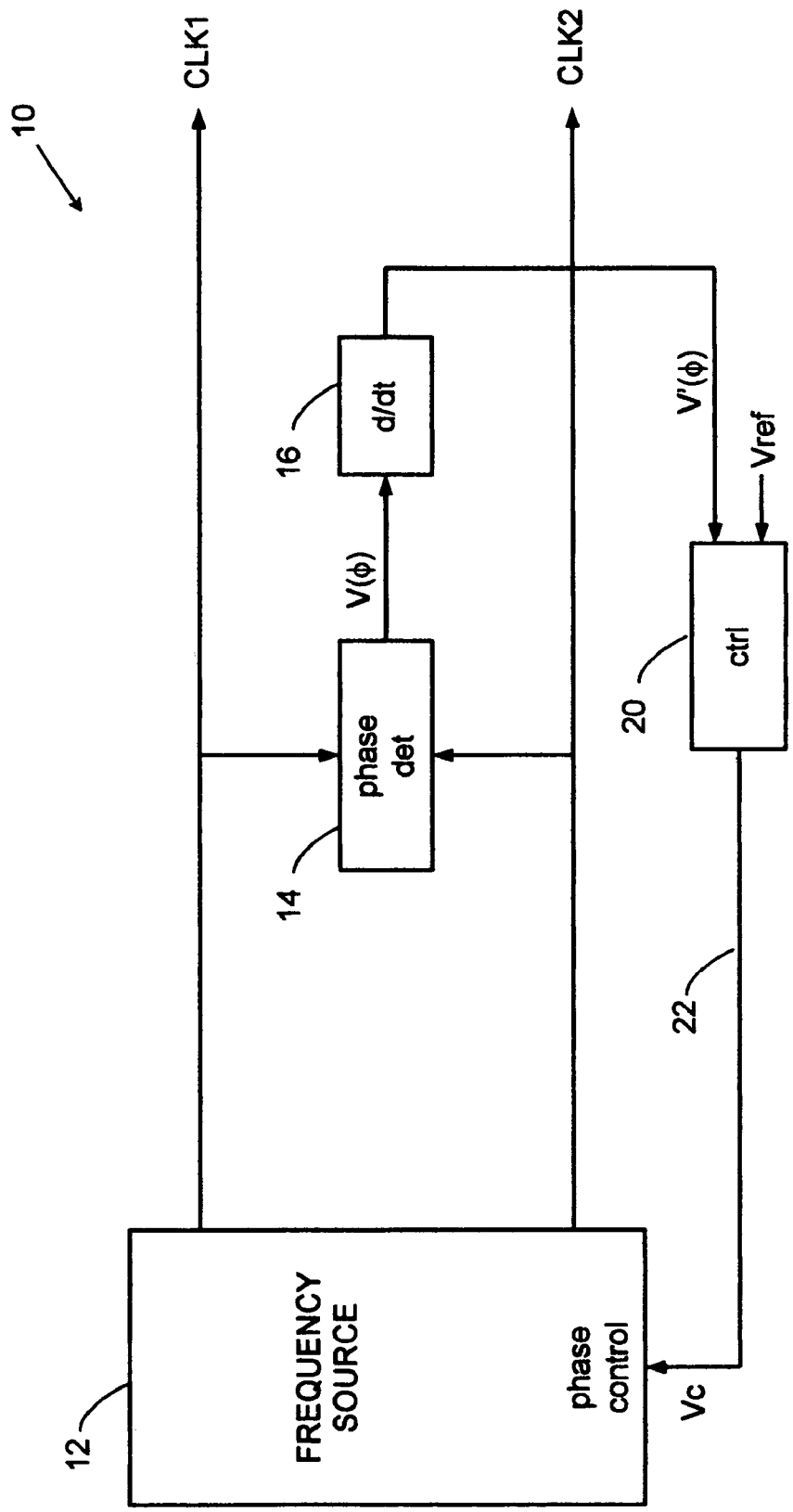
FIG. 1 is a rate locked loop of the present invention.

Turning now to the drawings, FIG. 1 shows a block diagram illustrating a general configuration of an RLL timing system 10 of the present invention. A frequency source 12 provides two clock signals, CLK1 and CLK2. Phase detector 14 compares the phase between CLK1 and CLK2 and outputs a voltage V($\phi$) that is proportional to the CLK1-CLK2 phase. A differentiator 16 differentiates V($\phi$) to produce a derivative voltage V'($\phi$) proportional to the rate-of-change in phase between CLK1 and CLK2. Voltage V'($\phi$) is constant when V($\phi$) changes at a linear rate, representing a constant phase slip. Controller 20 compares V'($\phi$) to a reference voltage Vref and produces a control voltage Vc proportional to V'($\phi$)−Vref. Voltage Vc is applied to a phase control port of frequency source 12, which controls the phase of CLK2 relative to CLK1.

Blocks 12, 14, 16, and 20, as shown in FIG. 1, are often arranged to form a high gain, high bandwidth continuous-mode feedback loop. Since the loop contains phase detector 14 and a derivative element 16, it controls a phase derivative, or rate-of-change in phase and locks the rate-of-change to a reference voltage Vref. Accordingly, the loop is a rate locked loop. For a constant Vref, the rate-of-change in phase is constant. If Vref is modulated, then the phase rate will be modulated, as may be desired in certain applications, such as nonlinear sweeps or spread spectrum applications.

FIG. 2a depicts a frequency source 12 having an independent reference oscillator 30, which is often a quartz crystal oscillator that may be temperature compensated (TCXO) or ovenized for greater stability. Oscillator 30 operates at a frequency of Fref. A frequency and phase controllable VCO 32 provides CLK2, which operates at a small offset frequency from Fref. Voltage Vc on control line 22 adjusts the VCO frequency and phase. Large changes in Vc change the VCO frequency while small changes in Vc change the instantaneous phase. For clarity, it should be noted that frequency a) is the rate of change in phase $\phi$ as can be seen from the expression for phase, $\phi=\omega t$, or $\omega=\phi/t$.

In addition, VCO 32 is often, but not limited to, a quartz crystal oscillator with a varactor phase/frequency control element. The bandwidth of the crystal limits the RLL loop control bandwidth and corresponding response time to about 2 ms, about 100 times faster than a PLL system operating at 10 Hz. The benefits of an RLL are even more pronounced when the offset frequency is lower than about 10 Hz, as may be the case in long range systems.

FIG. 2b depicts another exemplary beneficial embodiment having a frequency source 12 based on a single oscillator 30, which directly provides CLK1. CLK2, in such an arrangement, is provided by a phase adjuster 34 coupled to the CLK1 line. The phase adjuster controls the phase of CLK2 in response to control voltage Vc on control line 22. In order to provide a continuously swept CLK2 phase, control voltage Vc on line 22 changes in response to loop controller 20, as shown in FIG. 1, to produce an accurate and smooth phase slip. However, the maximum phase range introduced by the phase adjust element (i.e., phase adjuster 34) is normally limited to less than $\frac{1}{2} \pi$. Larger phase ranges are possible by cascading phase adjust element 34 or by employing other phase or time delay circuits known in the art.

Figure 2C:
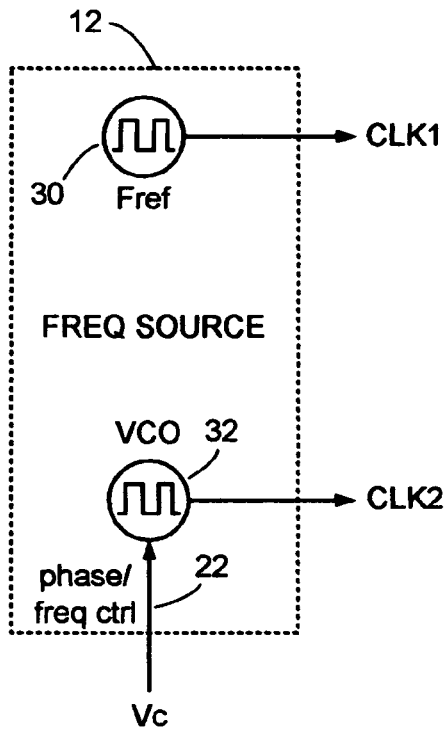
FIG. 2c is a phase adjuster.
Figure 2C:
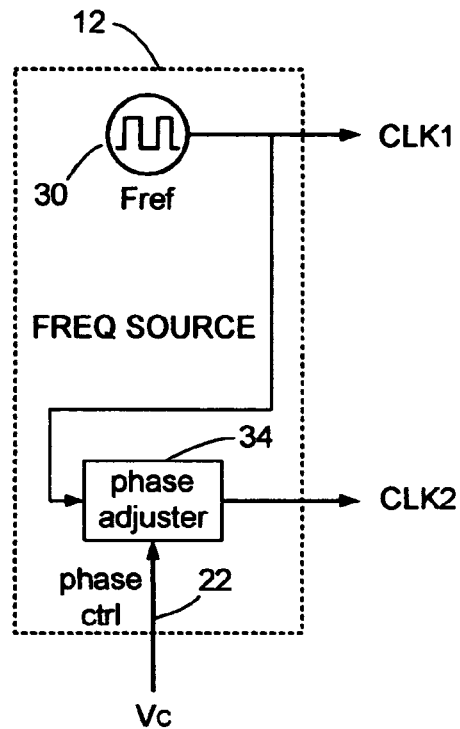
Figure 2C:
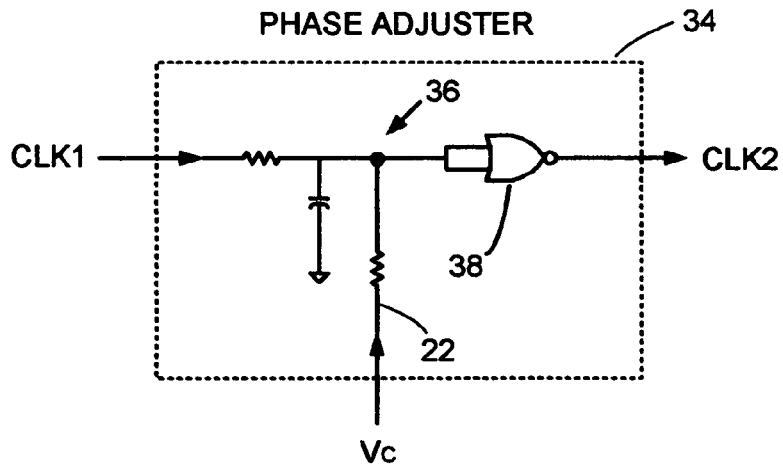

FIG. 2c is an exemplary phase adjuster circuit that includes an RC network 36, generally coupled to a threshold element 38, a logic gate in this example. RC network 36 slows the CLK1 risetime, and voltage Vc on line 22 provides an offset voltage that is applied to the input of gate 38. The exact time that gate 38 thresholds on its input is a function of its input offset voltage. Therefore the timing, i.e. the phase, of dock CLK2 is controlled by Vc.

Figure 3A:
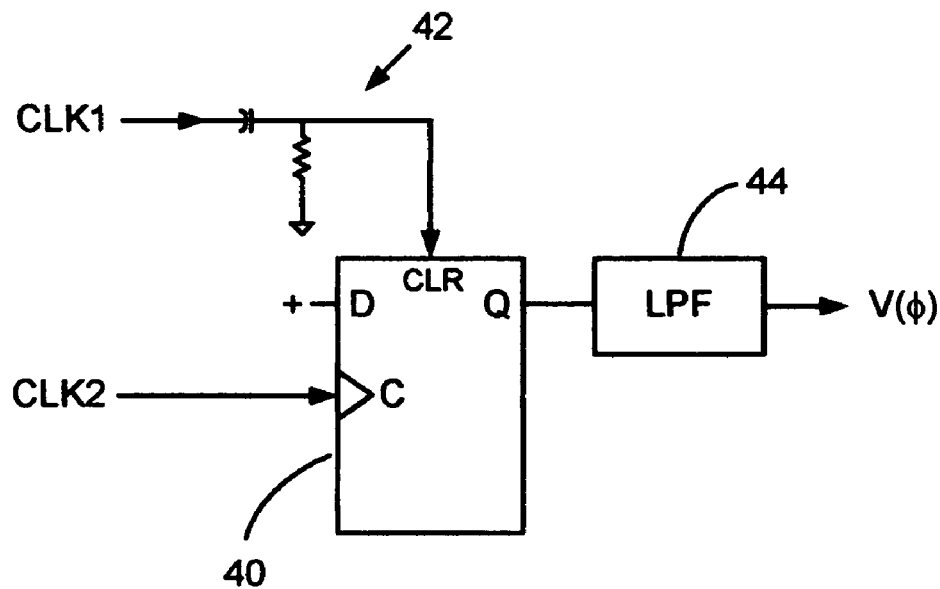
FIG. 3a is a phase comparator.

FIG. 3a is an exemplary phase detector 14, as shown in FIG. 1, based on a D-input latch 40. Latch 40 is cleared by CLK1 via edge coupling network 42. After clearing, the next CLK2 edge sets latch 40 so that the duty cycle of the Q output is proportional to the phase between CLK1 and CLK2. Low pass filter 44 averages the duty cycle into a voltage V($\phi$) proportional to phase.

Figure 3B:
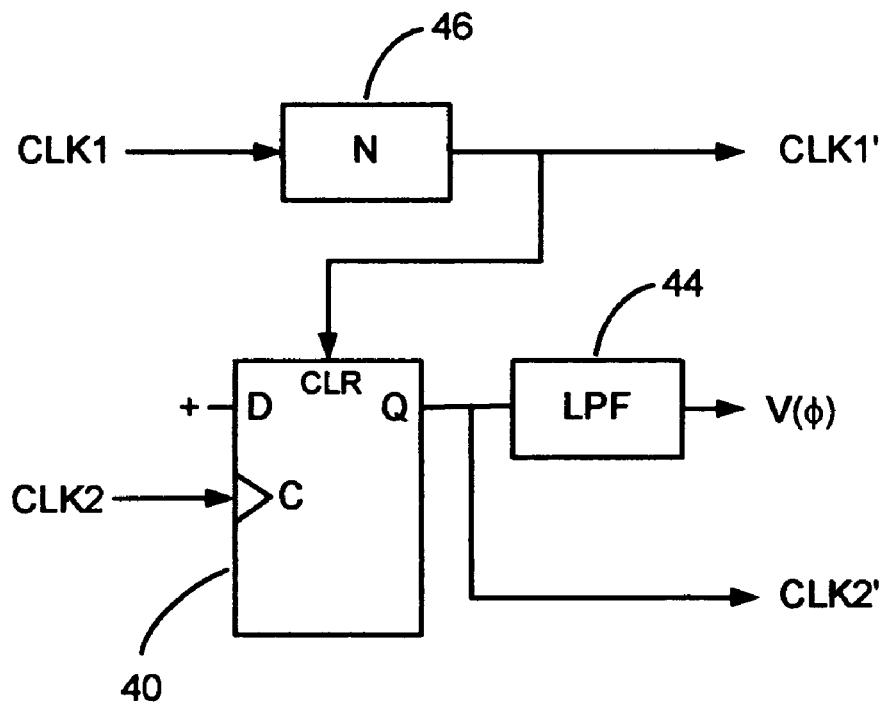
FIG. 3b is a phase comparator for harmonically related clocks.

FIG. 3b depicts a further example of a phase detector wherein the CLK1 signal is frequency divided by an integer N in counter 46, such that V($\phi$) is proportional to the phase between a sub-multiple of the CLK1 frequency and the direct frequency of CLK2. Counter 46 output is CLK1' at a sub-multiple N of CLK1. When the CLK1' is at a logic 1, latch 40 remains cleared, and when CLK1' is at logic 0, the next trigger edge of CLK2 sets Q high. Since CLK2 occurs at a higher rate than CLK1', the Q output, which is also CLK2, ranges over less than $2\pi$. For N=4, the phase range is $\frac{1}{4}\pi$, a desirable range for many ranging systems. Further details on this harmonic mode can be found in U.S. Pat. No. 6,072,427, "PRECISION RADAR TIMEBASE USING HARMONICALLY RELATED OFFSET OSCILLATORS," by Thomas E. McEwan, the applicant of the present invention.

Figure 4A:
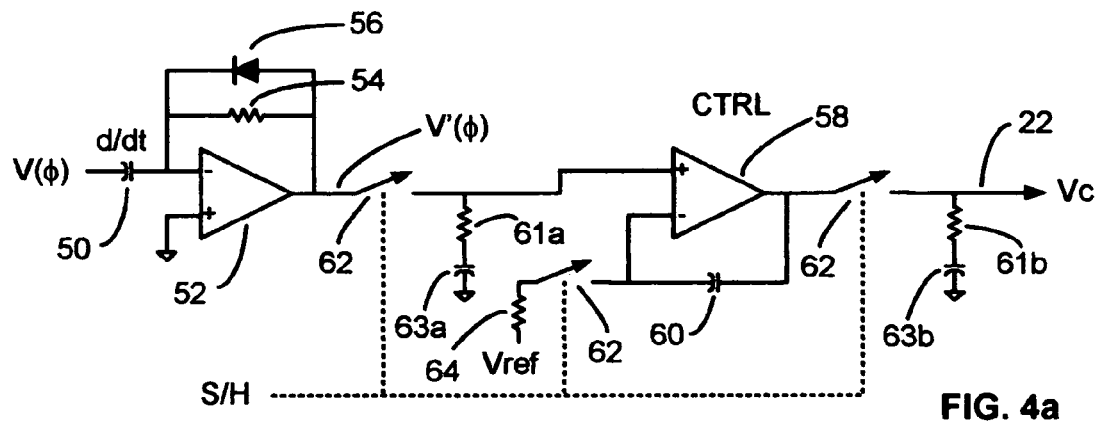
FIG. 4a is a derivative circuit and a controller.
Figure 4B:
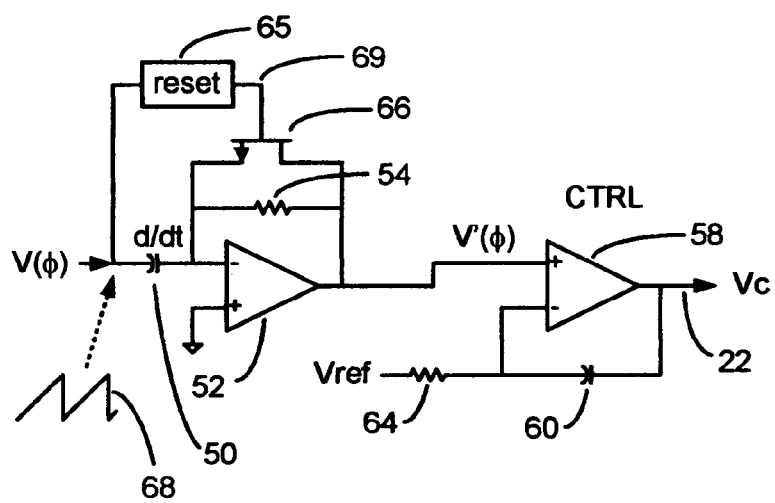
FIG. 4b is a derivative circuit including a reset switch and a controller.

FIG. 4a is an implementation of differentiator 16 and controller 20, as shown in FIG. 1. Phase detector 14 output $V(\phi)$ is applied to differentiation capacitor 50, also labeled d/dt, which is coupled to the input of a transimpedance amplifier that can include op amp 52 and feedback resistor 54, forming, in combination with capacitor 50, a classic differentiator. Diode 56 conducts during the phase wrap transition, i.e., during the fast negative edges seen in waveform 68, (i.e., the waveform of $V(\phi)$ as illustrated in FIG. 4b.) and acts to speed settling to the next ramp of $V(\phi)$. Three sample-hold (S/H) switches 62 are normally closed. Control op amp 58 compares derivative voltage $V'(\phi)$ from the differentiator to reference voltage Vref and greatly amplifies the $V'(\phi)$–Vref difference to provide a feedback control voltage Vc on line 22 to the phase control of frequency source 12. Capacitor 60 and resistor 64 define the control loop bandwidth. Hold capacitors 63a, 63b charge to $V'(\phi)$ and Vc, respectively. Bandwidth limiting resistors 61a, 61b assure the voltages on capacitors 63a, 63b represent a smoothed value and not an instantaneous noise peak. S/H switches 62 are opened by a pulse applied to the dashed S/H control line of FIG. 4b shortly before the phase wrap to hold voltage Vc on control line 22 and block large $V'(\phi)$ glitches from coupling onto line 22 and to the VCO or phase control. Switches 62 close shortly after the phase wrap. The S/H control pulse can be derived from $V(\phi)$. Phase wrap glitches can limit the timing accuracy. Exemplary op amps 52, 58 are Texas Instruments, Inc. TLV274 and S/H switches 62 are Motorola, Inc. CMOS analog switches 74HC4066.

FIG. 4b is another implementation of differentiator 16 and controller 20, as shown in FIG. 1 that is suited for use with a single oscillator frequency source (e.g., source 12 as described with reference to FIG. 2b). When using a single frequency source and a phase adjuster circuit, phase wraps can be set at an arbitrary point, rather than occurring at $2\pi$ or an exact fraction of $2\pi$. When phase ramp voltage $V(\phi)$ exceeds a reset threshold inside reset element 65, a reset pulse is applied to FET 66 via line 69 to force $V'(f)$ to 0, which then forces control op amp 58 to swing to a minimum, which in turn sets phase adjuster 34, as shown in FIG. 2b, to a minimum. When the reset pulse ends, control op amp 58 equilibrates back to a sweep mode wherein the phase adjuster 34 sweeps the CLK2 phase at a constant rate-of-change, producing another $V(\phi)$ voltage ramp. The period of voltage ramp 68 is set by capacitor 50, resistor 54 and Vref in relation to the amplitude of ramp 68. These analog values do not yield extremely high accuracy, but an accuracy of 0.1% of full scale range is practical. Again, similar to the embodiment as shown in FIG. 4a, feedback control voltage Vc is provided on line 22 for the phase control of frequency source 12, as shown in FIG. 1, and capacitor 60 and resistor 64 define the control loop bandwidth.

The sweep rate produced by the circuit of FIG. 4a also depends on analog values and is not particularly accurate. The period of the expanded time sweep is generally accurate to only a few percent. However, the expanded time sweep period corresponds to the realtime sweep period of CLK2, which is locked to the reference oscillator. To obtain a precision measurement, the expanded time range reading must be set as a ratio against the expanded time period. This ratio divides out the period inaccuracies. Expanded time range PWM (pulse width modulation) is measured to obtain the best precision. Alternatively, the sweep period can be phase locked to a precision reference, e.g., a 10 Hz clock, to make the sweep period precise. The expanded time range reading can then be measured to obtain a precision measurement without recourse to measuring the sweep period.

Figure 5:
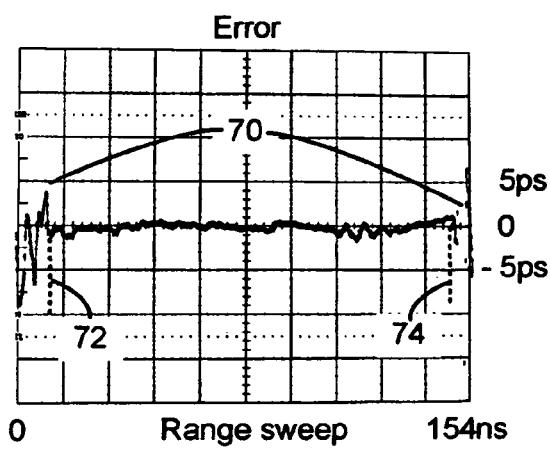
FIG. 5 is a laboratory derived error plot for the RLL of FIG. 1.

FIG. 5 is a plot of the phase error between CLK1' and CLK2' for an actual implementation of FIG. 1 using harmonically related clocks and the phase comparator of FIG. 3b. Errors are indicated in the temporal equivalent of 5 picoseconds per division across a sweep range of 154 ns. CLK1' is operated at 1.625 MHz and CLK2 at 6.5 MHz in a harmonic system as described with reference to FIG. 3b. Hence the sweep range is 1/6.5 MHz=154 ns, which corresponds to a phase range of $\frac{1}{4}\pi$. The plot indicates phase wrap errors 70 that lie outside the effective timing range. Range marker 72 corresponds to zero range and the range marker 74 is the maximum range for a rangefinder implementation. Errors between markers 72, 74 are on the order of 1-picosecond, or less than 0.001% of full scale range.

Figure 6:
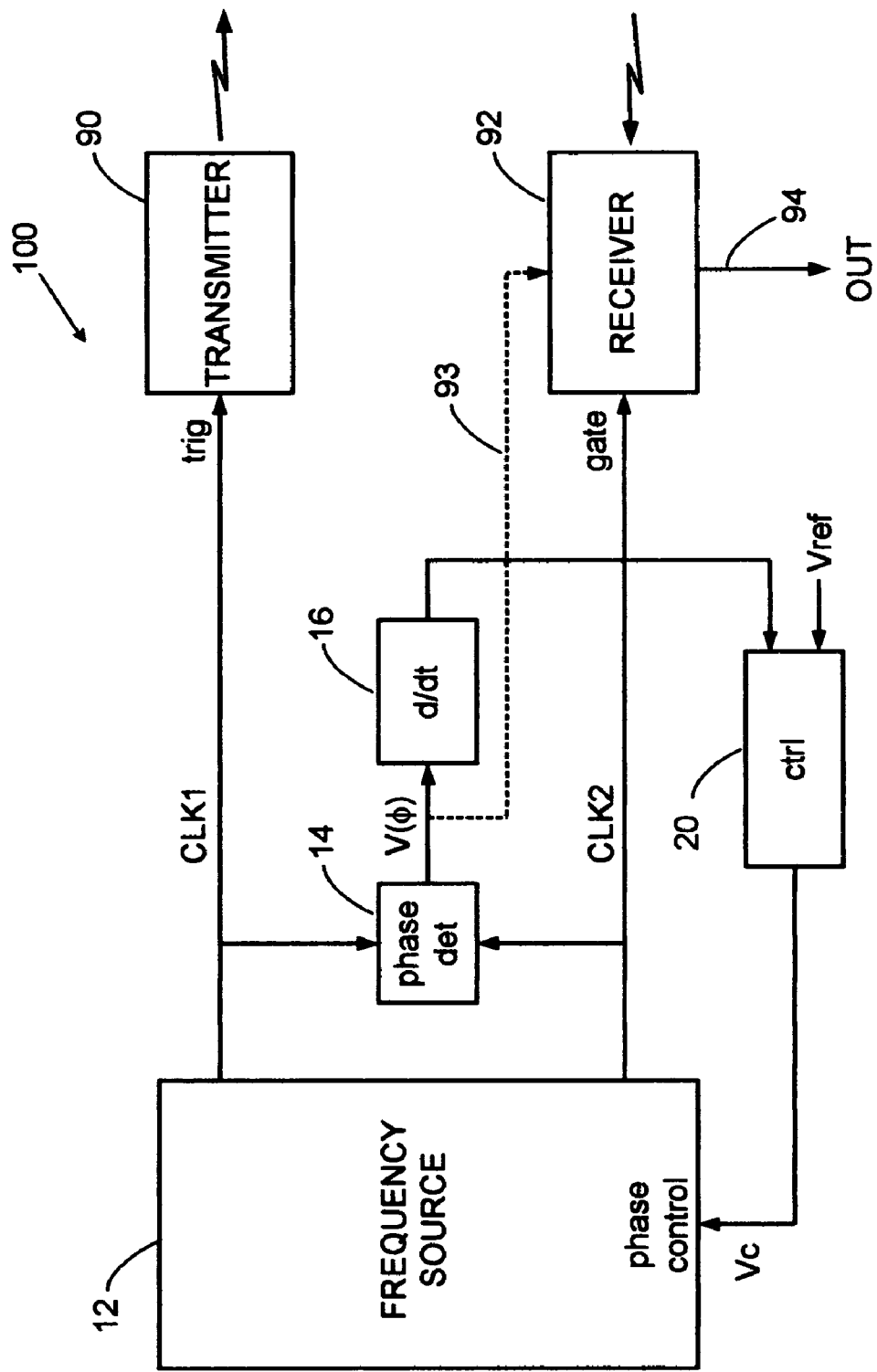
FIG. 6 depicts the present invention in a ranging system.

FIG. 6 illustrates a general pulse-echo rangefinder 100 incorporating timing system 10, as shown in FIG. 1, of the present invention. Frequency source 12 provides CLK1 and CLK2 signals to transmitter 90 and receiver 92. CLK1 triggers transmit pulses and transmitter 90 radiates corresponding radio or optical transmit pulses. Alternatively, transmitter 90 transmits electrical pulses along a conductor in a time domain reflectometer. Receiver 92 receives echo pulses produced by the transmitter. CLK2 gates the receiver, causing it to sample echoes at the instant of gating. Samples are output from the receiver on line 94 in expanded time as the phase of CLK2 slips relative to CLK1. The samples on line 94 may occur on a pulse-by-pulse basis, one for each pulse of CLK2, or the samples may be integrated to form an integrated output representing many CLK2 cycles. Receiver 92 may further include processing as known in the art, in which case the output on line 94 represents a processed output arising from samples taken at timing instants defined by CLK2.

Phase ramp voltage $V(\phi)$ can be optionally coupled to receiver 92 via line 93 to control a variable gain amplifier to compensate echo versus range loss. Other uses for phase ramp voltage $V(\phi)$ include detecting the phase wraps at $2\pi$ for generating reset pulses, generating sample-hold control pulses for controller 20, or for providing an analog indication of range. Blocks 12, 14, 16 and 20 form an RLL, which provides precision timing for rangefinder system 100. Transmitter 90 and receiver 92 may be fashioned to operate with a single radiator or lens, or in the case of TDR, may be coupled onto a single conductor, as known in the art.

Changes and modifications in the specifically described embodiments can be carried out without departing from the scope of the invention which is intended to be limited only by the scope of the appended claims.

What is claimed is:

1. A rate locked loop, comprising:
a frequency source for providing a first and second clock signal and further comprising a phase control, wherein the phase control adjusts the phase between the clock signals, a phase detector responsive to the phase between the first and second clock signals for producing a phase detector output proportional to phase, a differentiator having an output proportional to the derivative of the phase detector output to produce a derivative signal; and a controller responsive to the derivative signal for producing a feedback signal to the phase control, wherein the first and second clock signals provide timing for a pulse-echo rangefinder.

2. The circuit of claim 1 wherein the frequency source comprises a reference oscillator to provide the first clock signal and a voltage controlled oscillator (VCO) having a frequency/phase control to provide the second clock signal.

3. The circuit of claim 1 wherein the frequency source comprises a reference oscillator to provide the first clock signal and a phase adjuster coupled to the reference oscillator to provide the second clock signal, wherein the phase adjuster further comprises a phase control.

4. The circuit of any of claims 1-3 further comprising producing a feedback signal to the phase control to produce a constant phase slip between the first and second clock signals.

5. The circuit of any of claims 1-3 wherein the second clock signal is harmonically related to the first clock signal.

6. A method for generating clock signals having a relative phase slip, comprising:

generating a first clock frequency, generating a second clock frequency, detecting the phase between the first and second clock frequencies to produce a phase signal, differentiating the phase signal to produce a derivative signal; and controlling the second clock phase using the derivative signal to produce a controlled phase slip.

7. The method of claim 6 wherein producing a controlled phase slip further comprises producing a controlled clock phase having a substantially constant rate of change in phase.

8. The method of claims 6 or 7 further comprising generating a second clock frequency at a harmonic of the first clock frequency.

9. A radar, laser or TDR ranging system comprising:

a transmitter triggered by a first clock signal, a receiver gated by a second clock signal, a phase detector responsive to phase between the first and second clock signals for producing a phase signal, a differentiator for producing a derivative signal from the phase signal, a phase control for adjusting the phase of the second clock signal; and a controller responsive to the derivative signal for producing a feedback control signal to the phase control.

10. The system of claim 9 wherein the second clock signal is provided by a VCO having a frequency/phase control port.

11. The system of claim 9 wherein the second clock signal is provided by a phase adjuster coupled to the first clock signal, the phase adjuster further comprising a phase control.

12. The system of any of claims 9-11 wherein producing a feedback control signal to the phase control further comprises producing a feedback control signal to the phase control to produce a constant phase slip between the first and second clock signals.

13. The system of claims 9 or 10 further comprising a second clock signal that is harmonically related to the first clock signal.

* * * * *